(12) United States Patent
Takeuchi et al.

(10) Patent No.: US 8,664,534 B2
(45) Date of Patent: Mar. 4, 2014

(54) PRINTED WIRING BOARD

(75) Inventors: Kazumasa Takeuchi, Chikusei (JP); Nozomu Takano, Chikusei (JP); Masaki Yamaguchi, Chikusei (JP); Makoto Yanagida, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 549 days.

(21) Appl. No.: 11/915,097

(22) PCT Filed: May 19, 2006

(86) PCT No.: PCT/JP2006/310046
§ 371 (c)(1),
(2), (4) Date: Jun. 30, 2010

(87) PCT Pub. No.: WO2006/123783
PCT Pub. Date: Nov. 23, 2006

(65) Prior Publication Data
US 2010/0270059 A1 Oct. 28, 2010

(30) Foreign Application Priority Data

May 20, 2005 (JP) ................ P2005-148150
May 18, 2006 (JP) ................ P2006-139126

(51) Int. Cl.
*H05K 1/00* (2006.01)
(52) U.S. Cl.
USPC ......................................... 174/254; 174/255
(58) Field of Classification Search
USPC ....................................................... 439/67
See application file for complete search history.

(56) References Cited

U.S. PATENT DOCUMENTS

| | | | | |
|---|---|---|---|---|
| 5,142,448 A * | 8/1992 | Kober et al. | .................. | 361/751 |
| 5,763,058 A * | 6/1998 | Isen et al. | ...................... | 428/209 |
| 6,252,010 B1 * | 6/2001 | Takeuchi et al. | .............. | 525/403 |
| 6,475,629 B1 * | 11/2002 | Takeuchi et al. | .............. | 428/450 |
| 6,617,528 B2 * | 9/2003 | Armezzani et al. | ........... | 174/263 |
| 8,093,502 B2 * | 1/2012 | Mikado et al. | ................. | 174/255 |
| 2002/0112880 A1 * | 8/2002 | Wakimoto et al. | ............ | 174/254 |

FOREIGN PATENT DOCUMENTS

| | | |
|---|---|---|
| JP | 58-025057 | 8/1981 |
| JP | 4-62885 | 2/1992 |
| JP | 5-007057 | 1/1993 |

(Continued)

OTHER PUBLICATIONS

Translation of the International Preliminary Report on Patentability for Application No. PCT/JP2006/310046, dated Dec. 6, 2007.

(Continued)

*Primary Examiner* — Ishwarbhai B Patel
(74) *Attorney, Agent, or Firm* — Antonelli, Terry, Stout & Kraus, LLP.

(57) ABSTRACT

It is an object of the present invention to provide a printed circuit board that can be housed at high density in the enclosures of electronic devices. The printed circuit board (40) according to a preferred embodiment of the invention has a construction with a substrate (1), a conductor (7) formed in a flexible region (36) and conductors (8,9) formed in non-flexible regions (46). The conductor (7) formed in the flexible region (36) has a total thickness of 1-30 μm, and the conductors (8,9) formed in the non-flexible regions (46) have a total thickness of 30-150 μm.

16 Claims, 3 Drawing Sheets

(56) References Cited

FOREIGN PATENT DOCUMENTS

| | | |
|---|---|---|
| JP | 6-302962 | 10/1994 |
| JP | 8-193139 | 7/1996 |
| JP | 2000-012991 | 1/2000 |
| JP | 2000-196205 | 7/2000 |
| JP | 2002-064271 | 2/2002 |
| JP | 2002-353592 | 12/2002 |
| JP | 2003-055486 | 2/2003 |
| JP | 2004-51689 | 2/2004 |
| JP | 2004-168942 | 6/2004 |
| JP | 2004-266170 | 9/2004 |
| JP | 2005-088309 | 4/2005 |
| JP | 2006-269979 | 10/2006 |
| TW | 200500387 | 1/2005 |

OTHER PUBLICATIONS

Taiwanese Official Action dated Dec. 29, 2011, for TW Application No. 095118057.

Japanese Official Action dated Oct. 2, 2012, for JP Application No. 2006-139126.

Japanese Official Action dated May 28, 2013, for JP Application No. 2012-134043.

* cited by examiner

PRINTED WIRING BOARD

TECHNICAL FIELD

The present invention relates to a printed circuit board.

BACKGROUND ART

Laminated sheets for printed circuit boards are obtained by stacking a prescribed number of prepregs comprising a resin composition with an electrical insulating property as the matrix, and heating and pressing the stack to form an integrated unit. Also, metal-clad laminated sheets are used when forming printed circuits by a subtractive process in the fabrication of printed circuit boards. Such metal-clad laminated sheets are manufactured by stacking metal foil such as copper foil on the prepreg surface (one or both sides), and heating and pressing the stack.

Thermosetting resins such as phenol resins, epoxy resins, polyimide resins, bismaleimide-triazine resins and the like are widely used as resins with electrical insulating properties. Thermoplastic resins such as fluorine resins or polyphenylene ether resins are also sometimes used.

However, the advancing development of data terminal devices such as personal computers and cellular phones has led to reduced sizes and higher densities of the printed circuit boards mounted therein. The mounting forms range from pin insertion types to surface mounting types, and are gradually shifting toward area arrays such as BGA (ball grid arrays) employing plastic substrates.

For a substrate on which a bare chip such as BGA is directly mounted, connection between the chip and substrate is usually accomplished by wire bonding which employs thermosonic bonding. Bare chip-mounted substrates are thus exposed to high temperatures of 150° C. and above, and the electrical insulating resins must therefore have a certain degree of heat resistance.

Such substrates are also required to have "repairability" so that the once mounted chips can be removed. This requires approximately the same amount of heat as for mounting of the chips, while the chip must be remounted later on the substrate and subjected to further heat treatment. Consequently, "repairable" substrates must exhibit thermal shock resistance against high temperature cycles. Conventional insulating resins have also sometimes exhibited peeling between the resins and fiber base materials.

For printed circuit boards there have been proposed prepregs comprising a fiber base material impregnated with a resin composition with polyamideimide as an essential component, in order to improve the intricate wiring formability in addition to thermal shock resistance, reflow resistance and crack resistance (for example, see Patent document 1). There have also been proposed heat resistant substrates comprising a fiber base material impregnated with a resin composition composed of a silicone-modified polyimide resin and a thermosetting resin (for example, see Patent document 2).

In addition, with the increasing miniaturization and high performance of electronic devices it has become necessary to house printed circuit boards with parts mounted in more limited spaces. Methods have therefore been adopted that involve disposing a plurality of printed circuit boards in a stack and connecting them together with a wire harness or flexible wiring board (for example, see Patent document 3). In some cases, rigid-flex substrates are used which are multilayer stacks comprising polyimide-based flexible substrates and conventional rigid boards (for example, see Patent document 4).

[Patent document 1] Japanese Unexamined Patent Publication No. 2003-55486.
[Patent document 2] Japanese Unexamined Patent Publication HEI No. 8-193139.
[Patent document 3] Japanese Unexamined Patent Publication No. 2002-064271.
[Patent document 4] Japanese Unexamined Patent Publication HEI No. 6-302962

DISCLOSURE OF THE INVENTION

Problems to be Solved by the Invention

In conventional printed circuit boards, however, the printed circuit boards are connected using wire harnesses or flexible wiring boards, and this has necessitated extra space for multilayering of the flexible boards and rigid substrates, making it difficult to achieve high density beyond a certain point.

In light of such circumstances, it is an object of the present invention to provide a printed circuit board that can be housed at high density in the enclosures of electronic devices.

Means for Solving the Problems

In order to achieve the object stated above, the printed circuit board of the invention is provided with a flexible substrate and a conductor formed on at least one side of the substrate, and is characterized by having a flexible region that bends and non-flexible regions that do not bend, wherein the thickness of the conductor formed in the flexible region is 1-30 μm and the thickness of the conductor formed in the non-flexible regions is 30-150 μm.

A flexible region that bends is a section that is folded when the printed circuit board is housed. The non-flexible regions that do not bend are sections that are not folded when the printed circuit board is housed, and for example, regions where stress is unintentionally applied in the folding direction are considered essentially non-bending and correspond to non-flexible regions.

Thus, by having a thickness of 1-30 μm for the conductor at the section or sections that bend and a thickness of 30-150 μm for the conductor at the sections that do not bend, the printed circuit board of the invention has a construction comprising both a flexible section or sections and rigid sections in an integral printed circuit board. A printed circuit board having this construction can be easily bent at the flexible section(s) and can therefore be housed at high density in the spaces of electronic devices and the like.

In the printed circuit board of the invention as described above, the thickness of the conductor formed in the non-flexible regions is preferably larger than the thickness of the conductor formed in the flexible region. This type of printed circuit board of the invention can easily be provided with non-flexible sections in a flexible printed circuit board by merely varying the thickness of the metal or other conductor which is usually very rigid. The structure is therefore simpler than a conventional rigid-flexible wiring board comprising a combination of a rigid wiring board and a flexible wiring board. Furthermore, since the rigid property is exhibited by a highly rigid metal, it is possible to achieve smaller thicknesses than with conventional rigid-flexible wiring boards. This permits more efficient housing in the limited spaces for housing in electronic devices and the like.

In other words, the printed circuit board of the invention is a printed circuit board provided with a flexible substrate and a conductor formed on at least one side of the substrate, and is characterized by having a flexible region that bends and non-flexible regions that do not bend, wherein the thickness of the conductor formed in the flexible region is smaller than the thickness of the conductor formed in the non-flexible regions.

In the printed circuit board of the invention, the thickness of the conductor formed in the flexible regions is preferably 6-60% of the thickness of the conductor formed in the non-flexible region. This will allow the non-flexible regions to maintain satisfactory rigidity while the flexible region exhibits satisfactory flexibility. The reliability of the printed circuit board is therefore improved.

More specifically, the conductor formed in the flexible region preferably has a thickness adjusted to 1-30 µm by etching. The conductor formed in the non-flexible regions preferably has a thickness adjusted to 30-150 µm by plating. The conductors in the flexible region and non-flexible regions will thus be satisfactorily adjusted to suitable thicknesses, so that the regions can more easily exhibit their desired flexibility or rigidity.

The substrate in the printed circuit board of the invention also preferably contains a fiber base material, and the fiber base material is preferably a glass cloth with a thickness of no greater than 50 µm. The substrate containing a fiber base material is one that is thin but can maintain sufficient strength at the bending section, while also exhibiting excellent dimensional stability. Thus, a printed circuit board comprising such a substrate is thin and easily folded at the flexible region, thereby further facilitating high density housing.

The substrate more preferably contains a thermosetting resin composition as the matrix. It most preferably contains a cured thermosetting resin composition. This type of substrate exhibits excellent electrical insulating properties in addition to excellent heat resistance.

The thermosetting resin composition preferably contains, specifically, at least one resin from among glycidyl group-containing resins, amide group-containing resins and acrylic resins. The substrate containing the thermosetting resin composition is one with satisfactory heat resistance and a good electrical insulating property, as well as mechanical strength and pliability, and can improve the strength and flexibility of the printed circuit board.

Effect of the Invention

Since the printed circuit board of the invention has conductors of prescribed thicknesses in flexible regions and non-flexible regions, and thus includes rigid sections and flexible sections in an integral structure, it is possible to achieve drastically reduced thicknesses compared to conventional rigid-flex boards and thereby eliminate requirements for extra space. High density housing can therefore be achieved in the limited spaces of electronic devices. Furthermore, since the substrate is also integrated therewith it is possible to use a single resin component to form the substrate, and excellent heat resistance, mechanical strength and impact resistance can be exhibited. When a fiber base material is included in the substrate, the fiber base material will also be present in the flexible region so that the folded section will maintain sufficient strength and excellent dimensional stability.

EXPLANATION OF SYMBOLS

1: Substrate, 2,3: copper foils, 4: etching resist patterns, 5: etching resist, 6: section to serve as flexible region, 7,8,9: conductors, 10: copper foils, 17,18,19: conductors, 20: plating resist pattern, 21: plated copper, 22: sections to serve as non-flexible regions, 23: plated copper, 24: plating resist pattern, 30: copper-clad laminate, 36: flexible region, 40: printed circuit board, 46: non-flexible regions, 56: flexible region, 60: printed circuit board, 66: non-flexible regions, 76: flexible region, 86: non-flexible regions, 116: non-flexible region conductors, 126: flexible region conductor.

BEST MODE FOR CARRYING OUT THE INVENTION

Preferred embodiments of the invention will now be described in detail.

A preferred fabrication process for a printed circuit board of the invention will be explained first. The printed circuit board is preferably fabricated using a copper-clad laminate provided with a substrate comprising a fiber base material and a pliable thermosetting resin composition, and a conductor composed of copper foil with a prescribed thickness laminated on both sides of the substrate. For working of the copper-clad laminate to obtain the printed circuit board, the step of forming the circuits from the conductors employs a method of etching the conductor formed on the region of the printed circuit board that will bend (flexible region), or a method of plating the conductor formed at the regions of the printed circuit board that will not bend (non-flexible regions), to adjust the conductors formed in both regions to their prescribed thicknesses. These etching and plating methods will now be explained with reference to FIG. 1 and FIG. 2.

(Method of Etching Conductor Formed in Flexible Region)

Figure 1:
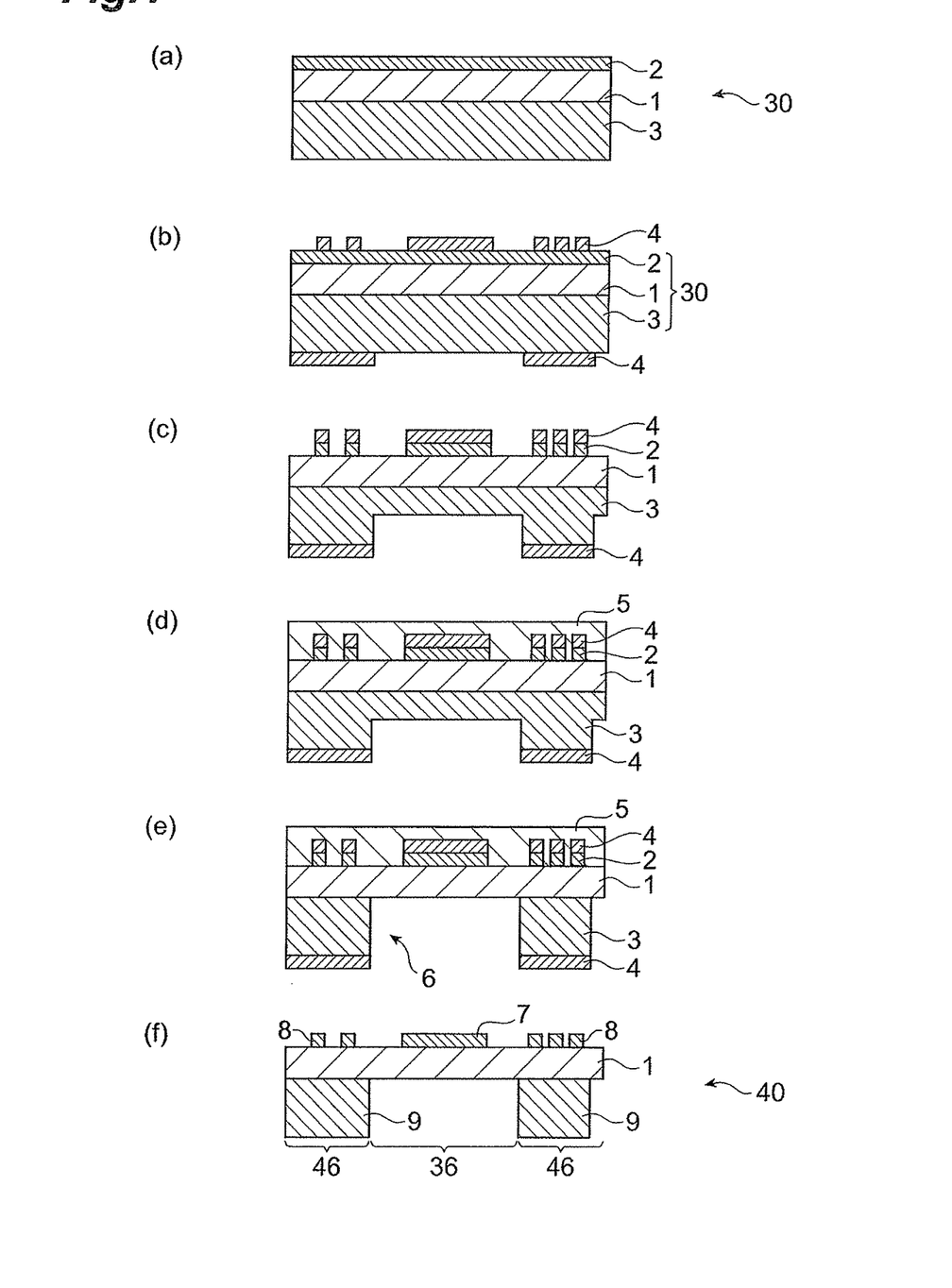
FIG. 1 is a cross-sectional process view schematically showing the steps for etching a conductor formed in a flexible region.

FIG. 1 is a cross-sectional process view schematically showing the steps for etching a conductor formed in a flexible region. First, as shown in FIG. 1(a), a copper-clad laminate 30 is prepared having a substrate 1 comprising a fiber base material and a pliable thermosetting resin composition, a copper foil 2 with a thickness of 18 µM laminated on one side of the substrate 1, and a copper foil 3 with a thickness of 70 µm laminated on the other side of the substrate 1.

Next, as shown in FIG. 1(b), an etching resist is laminated on the surfaces of the copper foil 2 and copper foil 3 of the copper-clad laminate 30, and then etching resist patterns 4 of the prescribed shapes are formed by a known photolithography step or the like. The etching resist patterns 4 have shapes that give the desired circuit patterns after etching of the copper foils 2 and 3.

This is followed by a known copper etching process for etching of the copper foils 2 and 3 at the regions where no etching resist pattern 4 is formed, to create prescribed patterns on the copper foils 2 and 3 as shown in FIG. 1(c). The etching is carried out to complete removal of the copper foil 2 (18 µm thickness) at the regions where no etching resist pattern 4 is formed. In this case, the regions of the 70 µm-thick copper foil 3 are left without being completely etched.

Next, as shown in FIG. 1(d), an etching resist 5 is laminated on the side of the substrate 1 where the copper foil 2 is formed, so as to completely cover it. Here, the etching resist patterns 4 are left on the surfaces of the copper foils 2 and 3. This opens up the region of the copper foil 3 where no etching resist pattern 4 is formed. This region becomes the flexible region 36 in the completed printed circuit board 40 as described below.

Next, as shown in FIG. 1(e), the opened section of the copper foil 3 is further etched for complete removal of copper foil at the section to serve as the flexible region 6 (flexibilized section). All of the etching resists (etching resist pattern 4 and etching resist 5) are then removed by a known resist release step. This yields a printed circuit board 40 as shown in FIG. 1(f), comprising a conductor 7 formed in the flexible region 36 and a conductor 8 and conductor 9 formed in the non-flexible regions 46, on the surfaces of the substrate 1.

The printed circuit board 40 obtained in this manner has a flexible region 36 with a total conductor thickness of 1-30 µm, and non-flexible regions 46 with a total conductor thickness of 30-150 µm. The total conductor thickness is the total thickness of all conductors in the thickness direction when a plurality are used, or if only one conductor is present in the thickness direction it is the thickness of that conductor alone. For this example, therefore, the thickness of the conductor formed in the flexible region 36 is the thickness of the conductor 7 (18 µm), while the thickness of the conductor formed in the non-flexible regions 46 is the thickness of the conductor 9 (70 µm), or the total thickness of the conductors 8 and 9 (88 µm).

This process, therefore, can produce a printed circuit board with prescribed thicknesses for the conductors formed in the flexible region and non-flexible regions, by patterning into a prescribed shape a conductor having a total thickness exceeding 30 µm which is formed on the substrate, and then etching the sections of the patterned conductor which are formed in the region which is to serve as the flexible region.

In the process described above, the copper foils 2,3 were patterned and then etched, but there is no limitation to this order, and instead the copper foils 2,3 may be etched first and then patterned. Also the copper foil 3, of the copper foils 2,3 formed on both sides of the substrate 1, was completely removed by etching to leave only the copper foil 2 on one side having the desired thickness in order to adjust the thickness of the conductor in the flexible region during this process, but alternatively, both of the copper foils 2,3 may be appropriately etched to adjust the total thickness of the conductors in the flexible region sections to the desired range.

(Method of Plating Conductors Formed in Non-Flexible Regions)

Figure 2:
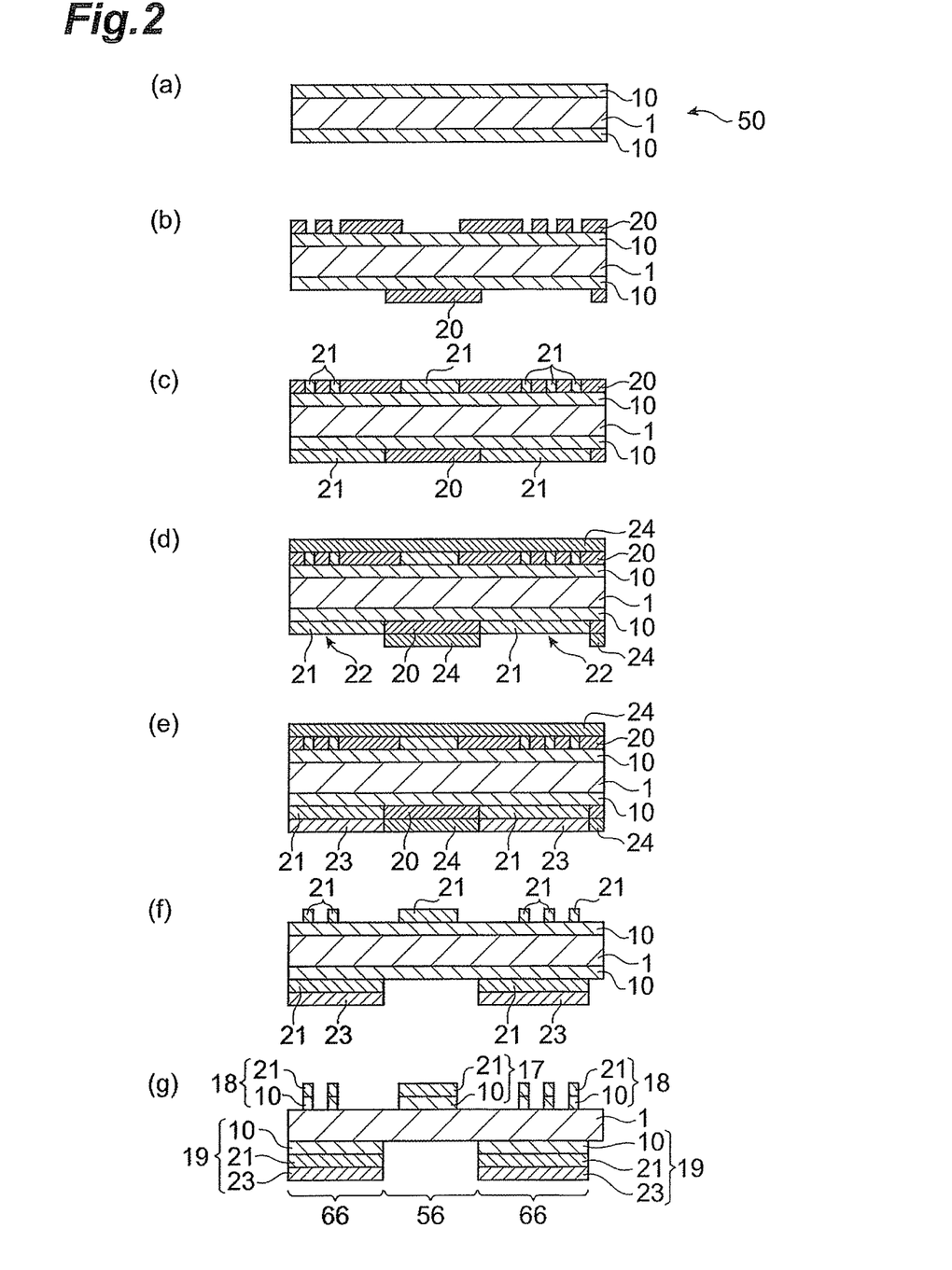
FIG. 2 is a cross-sectional process view schematically showing the steps for plating a conductor formed in a non-flexible region.

FIG. 2 is a cross-sectional process view schematically showing the steps for plating conductors formed in non-flexible regions. First, as shown in FIG. 2(a), a copper-clad laminate 50 is prepared having a substrate 1 comprising a fiber base material and a pliable thermosetting resin composition, and copper foils 10 with a thickness of 3 µm laminated on both sides of the substrate 1.

Next, as shown in FIG. 2(b), plating resists are formed on the surfaces of the copper foils 10 of the copper-clad laminate 50, and then plating resist patterns 20 with prescribed shapes are formed by a known photolithography step or the like. The plating resist patterns 20 have shapes that give the desired circuit patterns after plating of the copper foils 10.

Next, as shown in FIG. 2(c), the copper foils 10 on which the plating resist patterns 20 have been formed are plated by electroplating to a prescribed thickness, whereby plated copper 21 is formed on the exposed surface of the copper foils 10.

Then, as shown in FIG. 2(d), both sides of the copper-clad laminate 50 on which the plated copper 21 has been formed and the plating resist patterns 20 have been formed, are further laminated with plating resist, after which they are patterned into shapes that open only the sections 22 which are to serve as the non-flexible regions 66 described hereunder (rigidized sections), to form plating resist patterns 24.

Next, as shown in FIG. 2(e), the surfaces of the plated copper 21 on which no plating resist pattern 24 is formed are plated by electroplating to a post-plating conductor thickness of 30-150 µm, to further form plated copper 23. As shown in FIG. 2(f), all of the plating resists (plating resist patterns 20 and plating resist patterns 24) are removed by a known resist release step.

The section of the copper foil 10 without formation of the plated copper 21 and plated copper 23 is removed by etching. This yields a printed circuit board 60 as shown in FIG. 2(f), comprising a conductor 17 formed in the flexible region and a conductor 18 and conductor 19 formed in the non-flexible regions, on the surfaces of the substrate 1.

The printed circuit board 60 obtained in this manner comprises a flexible region 56 with a total conductor thickness (the thickness of the conductor 17 in this case) of 1-30 µm, and non-flexible regions 66 with a total conductor thickness (the thickness of the conductor 19 alone or the total thickness of the conductors 18 and 19) of 30-150 µm.

This process, therefore, can produce a printed circuit board with prescribed thicknesses for the conductors formed in the flexible region and non-flexible regions, by forming plated copper with a prescribed pattern onto the conductors formed on the substrate, to a total copper thickness of no greater than 30 mm, and then further plating the sections of the patterned plated copper which are formed in the regions which are to serve as the non-flexible regions.

In the process described above, the conductor on only one side of the substrate 1 (copper foil 10 and copper 21) was plated to a total conductor thickness of 30-150 µm in the non-flexible regions, but there is no restriction to this method, and instead the plating may be carried out on the conductors on both sides of the substrate 1 formed in the non-flexible regions. Also, the plating for pattern formation (plated copper 21) in this process was followed by plating to adjust the thickness of the conductor in the non-flexible regions (plated copper 23), but instead, for example, the plating for adjustment of the thickness of the conductor in the non-flexible regions may be carried out first, and then the plated copper foil 10 etched for patterning of the conductor.

A process of etching the conductor in the flexible region and a process of plating the conductors in the non-flexible regions were explained above as preferred processes for fabrication of the printed circuit board, and both of these processes may be carried out for fabrication of the printed circuit board. That is, fabrication of a single printed circuit board may incorporate both etching of the conductor in the flexible region and plating of the conductor in the non-flexible regions. This will allow the conductors in the flexible region and non-flexible regions to have the prescribed thicknesses regardless of the original thicknesses of the copper foils of the copper-clad laminate.

A preferred construction for the printed circuit board will now be explained in detail. The printed circuit board 40 shown in FIG. 1(f) will be referred to in the following explanation, but any construction may be applied to the printed circuit board of the invention without restrictions.

As shown in the drawing, the printed circuit board 40 has a construction with a conductor 7 formed on the flexible region 36 and conductors 8 formed on the non-flexible regions 46, on one side of the substrate 1, and with conductors 9 formed in the non-flexible regions on the other side. As mentioned above, this printed circuit board 40 is constructed so that the total thickness of the conductor formed in the flexible region 36 (the thickness of the conductor 7) is 1-30 µm and the total thickness of the conductors formed in the non-flexible regions 46 (the thickness of the conductor 9 or the total thickness of the conductors 8 and 9) is 30-150 µm.

In the printed circuit board 40, therefore, the conductors formed in the flexible region 36 and the non-flexible regions 46 have the total thicknesses in the ranges specified above, thereby facilitating folding of the flexible region 36 while maintaining adequate rigidity of the non-flexible regions 46. Thus, this type of printed circuit board 40 can be easily housed at high density by folding even in limited spaces such as inside electronic devices. In particular, because this printed circuit board 40 is an integral unit it does not require connection or multilayering between boards as in the prior art, so that much higher densities can be achieved as a result and excellent reliability is exhibited.

From the viewpoint of obtaining the effect described above in a more satisfactory manner, the total thickness of the conductor formed in the flexible region 36 of the printed circuit board 40 is preferably 3-25 µm and more preferably 8-20 µm. The total thickness of the conductors formed in the non-flexible regions 46 is preferably 60-120 µm and more preferably 70-100 µm. The total thickness of the conductor formed in the flexible region 36 is preferably smaller than the total thickness of the conductors formed in the non-flexible regions 46. Specifically, the former is preferably 6-60% and more preferably 10-30% of the latter.

The substrate 1 in the printed circuit board 40 is not limited to comprising a fiber base material and pliable thermosetting resin composition as described above, and any materials which are flexible and allow lamination of conductors may be used without any particular restrictions. A polyimide film or aramid film may be employed, for example. From the viewpoint of flexibility and strength, the substrate is preferably one containing a fiber base material.

Any fiber base material may be used which is used for fabrication of metal foil-clad laminates or multilayer printed circuit boards, with no particular restrictions, and as preferred examples there may be mentioned fiber base materials such as woven fabrics and nonwoven fabrics. The material of the fiber base material may be inorganic fiber such as glass, alumina, boron, silica-alumina glass, silica glass, tyranno, silicon carbide, silicon nitride, zirconia or the like, or organic fiber such as aramid, polyetheretherketone, polyetherimide, polyethersulfone, carbon, cellulose or the like, or a mixed fiber sheet of the above. Glass fiber woven fabrics are preferred.

When a prepreg is used as the material to form the substrate 1, the base material in the prepreg is most preferably a glass cloth with a thickness of no greater than 50 µm. Using a glass cloth with a thickness of no greater than 50 µm will facilitate fabrication of a printed circuit board that is flexible and freely foldable. It can also reduce dimensional changes that occur with temperature variation and moisture absorption during the fabrication process.

The substrate 1 is preferably one containing a highly pliable insulating resin in a fiber base material. That is, it preferably has a structure with a fiber base material disposed in an insulating resin. The insulating resin preferably contains a thermosetting resin composition, and specifically it more preferably contains a cured thermosetting resin composition. The thermosetting resin in the thermosetting resin composition may be, for example, an epoxy resin, polyimide resin, unsaturated polyester resin, polyurethane resin, bismaleimide resin, triazine-bismaleimide resin, phenol resin or the like.

The thermosetting resin in the thermosetting resin composition is preferably a glycidyl group-containing resin, more preferably a resin with glycidyl groups at the end, and even more preferably an epoxy resin. As epoxy resins there may be mentioned polyglycidyl ethers obtained by reacting epichlorhydrin with a polyhydric phenol such as bisphenol A, a novolac-type phenol resin or an orthocresol/novolac-type phenol resin or a polyhydric alcohol such as 1,4-butanediol, polyglycidyl esters obtained by reacting epichlorhydrin with a polybasic acid such as phthalic acid or hexahydrophthalic acid, N-glycidyl derivatives of compounds with amine, amide or heterocyclic nitrogen bases, and alicyclic epoxy resins.

If an epoxy resin is included as the thermosetting resin it is possible to carry out curing at a temperature of below 180° C. during molding of the substrate 1, while better thermal, mechanical and electrical properties will tend to be exhibited by the substrate 1.

A thermosetting resin composition containing an epoxy resin as the thermosetting resin also more preferably contains an epoxy resin curing agent or curing accelerator. For example, there may be used combinations of an epoxy resin with two or more glycidyl groups and a curing agent therefor, an epoxy resin with two or more glycidyl groups and a curing accelerator, or an epoxy resin with two or more glycidyl groups and a curing agent and curing accelerator. An epoxy resin with more glycidyl groups is preferred, and it even more preferably has three or more glycidyl groups. The preferred content of the epoxy resin will differ depending on the number of glycidyl groups, and the content may be lower with a larger number of glycidyl groups.

The epoxy resin curing agent and curing accelerator may be used without any particular restrictions so long as they react with the epoxy resin to cure it and accelerate curing. As examples there may be mentioned amines, imidazoles, polyfunctional phenols, acid anhydrides and the like. As amines there may be mentioned dicyandiamide, diaminodiphenylmethane and guanylurea. As polyfunctional phenols there may be used hydroquinone, resorcinol, bisphenol A and their halogenated forms, as well as novolac-type phenol resins and resol-type phenol resins that are condensates with formaldehyde. As acid anhydrides there may be used phthalic anhydride, benzophenonetetracarboxylic dianhydride, methylhymic acid and the like. As curing accelerators there may be used imidazoles including alkyl group-substituted imidazoles, benzimidazoles and the like.

Suitable contents for the curing agent or curing accelerator in the thermosetting resin composition are as follows. In the case of an amine, for example, it is preferably an amount such that the equivalents of active hydrogen in the amine are approximately equal to the epoxy equivalents of the epoxy resin. For an imidazole as the curing accelerator there is no simple equivalent ratio with active hydrogen, and its content is preferably about 0.001-10 parts by weight with respect to 100 parts by weight of the epoxy resin. For polyfunctional phenols or acid anhydrides, the amount is preferably 0.6-1.2 equivalents of phenolic hydroxyl or carboxyl groups per equivalent of the epoxy resin.

If the amount of curing agent or curing accelerator is less than the preferred amount, the uncured epoxy resin will remain after curing, and the Tg (glass transition temperature) of the cured thermosetting resin composition will be lower. If it is too great, on the other hand, unreacted curing agent or curing accelerator will remain after curing, potentially reducing the insulating property of the thermosetting resin composition.

A high-molecular-weight resin component may also be included as a thermosetting resin in the thermosetting resin composition for the substrate 1, for improved pliability or heat resistance. As such thermosetting resins there may be mentioned amide group-containing resins and acrylic resins.

Polyamideimide resin is preferred as an amide group-containing resin, and siloxane-modified polyamideimide having a siloxane-containing structure is especially preferred. The siloxane-modified polyamideimide is most preferably one obtained by reaction of an aromatic diisocyanate with a mixture containing diimidedicarboxylic acid obtained by reaction of trimellitic anhydride and a mixture of a diamine with two or more aromatic rings (hereinafter, "aromatic diamine") and a siloxanediamine.

The polyamideimide resin is preferably one containing at least 70 mol % of polyamideimide molecules having 10 or more amide groups in the molecule. The range for the content of the polyamideimide molecule can be obtained using a chromatogram from GPC of the polyamideimide and the separately determined number of moles of amide groups (A) per unit weight of the polyamideimide. Specifically, based on the number of moles of amide groups (A) in the polyamideimide (a) g, 10×a/A is first determined as the molecular weight (C) of the polyamideimide containing 10 amide groups per molecule. A resin wherein at least 70% of the regions have GPC chromatogram-derived number-average molecular weights of C or greater is judged as "containing at least 70 mol % of polyamideimide molecules having 10 or more amide groups in the molecule". The method of quantifying the amide groups may be NMR, IR, a hydroxamic acid-iron color reaction or an N-bromoamide method.

A siloxane-modified polyamideimide having a siloxane-containing structure is preferably one wherein the mixing ratio of the aromatic diamine (a) and siloxanediamine (b) is preferably a/b=99.9/0.1–0/100 (molar ratio), more preferably a/b=95/5–30/70 and even more preferably a/b=90/10–40/60. An excessively large mixing ratio for the siloxanediamine (b) will tend to lower the Tg. If it is too small, however, the amount of varnish solvent remaining in the resin during fabrication of the prepreg will tend to increase.

As examples of aromatic diamines there may be mentioned 2,2-bis[4-(4-aminophenoxy)phenyl]propane, (BAPP), bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4'-bis(4-aminophenoxy)biphenyl, bis[4-(4-aminophenoxy)phenyl]ether, bis[4-(4-aminophenoxy)phenyl]ketone, 1,3-bis(4-aminophenoxy)benzene, 1,4-bis(4-aminophenoxy)benzene, 2,2'-dimethylbiphenyl-4,4'-diamine, 2,2'-bis(trifluoromethyl)biphenyl-4,4'-diamine, 2,6,2',6'-tetramethyl-4,4'-diamine, 5,5'-dimethyl-2,2'-sulfonyl-biphenyl-4,4'-diamine, 3,3'-dihydroxybiphenyl-4,4'-diamine, (4,4'-diamino)diphenyl ether, (4,4'-diamino)diphenylsulfone, (4,4'-diamino)benzophenone, (3,3'-diamino)benzophenone, (4,4'-diamino)diphenylmethane, (4,4'-diamino)diphenyl ether and (3,3'-diamino)diphenyl ether.

As siloxanediamines there may be mentioned those represented by the following general formulas (3)-(6). In the following formulas, n and m each represent an integer of 1-40.

[Chemical Formula 1]

(3)

[Chemical Formula 2]

(4)

[Chemical Formula 3]

(5)

[Chemical Formula 4]

(6)

Examples of siloxanediamines represented by general formula (3) above include X-22-161AS (amine equivalents: 450), X-22-161A amine equivalents: 840) and X-22-161B (amine equivalents: 1500) (products of Shin-Etsu Chemical Co., Ltd.), and BY16-853 (amine equivalents: 650) and BY16-853B (amine equivalents: 2200) (products of Toray Dow Corning Silicone Co., Ltd.). Examples of siloxanediamines represented by general formula (6) above include X-22-9409 (amine equivalents: 700) and X-22-1660B-3 (amine equivalents: 2200) (products of Shin-Etsu Chemical Co., Ltd.).

For production of a siloxane-modified polyamideimide, a portion of the aromatic diamine may optionally be replaced with an aliphatic diamine as the diamine component. As such aliphatic diamines there may be mentioned compounds represented by the following general formula (7).

[Chemical Formula 5]

(7)

In this formula, X represents methylene, sulfonyl, ether, carbonyl or a single bond, $R^1$ and $R^2$ each independently represent hydrogen, alkyl, phenyl or a substituted phenyl group, and p is an integer of 1-50. Preferred for $R^1$ and $R^2$ are hydrogen, C1-3 alkyl, phenyl and substituted phenyl groups. As substituents that may be bonded to substituted phenyl groups there may be mentioned C1-3 alkyl groups, halogen atoms and the like.

As aliphatic diamines there are particularly preferred compounds of general formula (7) above wherein X is an ether group, from the viewpoint of achieving both a low elastic modulus and a high Tg. Examples of such aliphatic diamines include JEFFAMINE D-400 (amine equivalents: 400) and JEFFAMINE D-2000 (amine equivalents: 1000).

The siloxane-modified polyamideimide can be obtained by reacting a diisocyanate with diimidedicarboxylic acid obtained by reacting a mixture containing the aforementioned siloxanediamine and aromatic diamine (preferably including an aliphatic diamine) with trimellitic anhydride. The diisocyanate used for the reaction may be a compound represented by the following general formula (8).

[Chemical Formula 6]

$$\text{OCN-D-NCO} \qquad (8)$$

In this formula, D is a divalent organic group with at least one aromatic ring or divalent aliphatic hydrocarbon group. For example, it is preferably at least one group selected from among groups represented by $-C_6H_4-CH_2-C_6H_4-$, tolylene, naphthylene, hexamethylene, 2,2,4-trimethylhexamethylene and isophorone.

As diisocyanates there may be mentioned both aromatic diisocyanates wherein D is an organic group with an aromatic ring, and aliphatic diisocyanates wherein D is an aliphatic hydrocarbon group. Aromatic diisocyanates are preferred diisocyanates, but preferably both of the above are used in combination.

As examples of aromatic diisocyanates there may be mentioned 4,4'-diphenylmethane diisocyanate (MDI), 2,4-tolylene diisocyanate, 2,6-tolylene diisocyanate, naphthalene-1,5-diisocyanate and 2,4-tolylene dimer. MDI is preferred among these. Using MDI as an aromatic diisocyanate can improve the flexibility of the obtained polyamideimide.

Examples of aliphatic diisocyanates include hexamethylene diisocyanate, 2,2,4-trimethylhexamethylene diisocyanate and isophorone diisocyanate.

When an aromatic diisocyanate and aliphatic diisocyanate are used in combination as mentioned above, the aliphatic diisocyanate is preferably added at about 5-10 mol % with respect to the aromatic diisocyanate. Using such a combination will tend to further improve the heat resistance of the polyamideimide.

An acrylic resin may also be used in addition to the glycidyl group-containing resin and the amide group-containing resin, as a thermosetting resin in the thermosetting resin composition used for the substrate 1. As acrylic resins there may be mentioned polymers of acrylic acid monomers, methacrylic acid monomers, acrylonitriles and glycidyl group-containing acrylic monomers, as well as copolymers obtained by copolymerization of these monomers. The molecular weight of the acrylic resin is not particularly restricted, but it is preferably 300,000-1,000,000 and more preferably 400,000-800,000 as the weight-average molecular weight based on standard polystyrene.

The thermosetting resin composition for the substrate 1 may also contain a flame retardant in addition to the aforementioned resin components. Including a flame retardant can improve the flame retardance of the substrate 1. For example, a phosphorus-containing filler is preferred as an added flame retardant. As phosphorus-containing fillers there may be mentioned OP930 (product of Clariant Japan, phosphorus content: 23.5 wt %), HCA-HQ (product of Sanko Co., Ltd., phosphorus content: 9.6 wt %), and the melamine polyphosphates PMP-100 (phosphorus content: 13.8 wt %), PMP-200 (phosphorus content: 9.3 wt %) and PMP-300 (phosphorus content: 9.8 wt %) (all products of Nissan Chemical Industries, Ltd.).

In the printed circuit board 40, the conductors 7, 8 and 9 are formed from the copper foils 2,3 of the copper-clad laminate 30 used for fabrication of the printed circuit board 40. Materials commonly used for conductors 7, 8 and 9 include the copper foils mentioned above as well as aluminum foil, but they are not particularly restricted so long as they are metal foils with a thickness of about 5-200 μm, ordinarily used for metal-clad laminated sheets and the like. In addition to a simple metal foil, there may be used a composite foil with a three-layer structure provided with an interlayer made of nickel, nickel-phosphorus, nickel-tin alloy, nickel-iron alloy, lead, lead-tin alloy or the like, having a 0.5-15 μm copper layer and a 10-300 μm copper layer on either side, or a composite foil with a two-layer structure comprising aluminum and copper foils.

An insulating sheet or laminated sheet for construction of the substrate 1, or a metal-clad laminated sheet such as a copper-clad laminate 30 used for fabrication of the printed circuit board 40, may be produced in the following manner, for example. Specifically, the fiber base material is first impregnated with the thermosetting resin composition and the thermosetting resin composition is semi-cured to prepare a prepreg. Next, metal foils such as the copper foils 2,3 are superposed onto one or both sides of the prepreg or a laminated body comprising a plurality of the laminated prepregs. The obtained laminated body is subjected to hot press molding at a temperature in the range of preferably 150-280° C. and more preferably 180° C.-250° C. and a pressure of preferably 0.5-20 MPa and more preferably 1-8 MPa. Thus, from the prepreg or laminated body there is produced an insulating sheet or laminated body corresponding to the substrate 1, or a copper-clad laminate 30 (metal-clad laminated sheet) having copper foils 2,3 laminated on both sides of the substrate 1.

The construction of a preferred printed circuit board was explained above, but the printed circuit board of the invention is not limited to the aforementioned monolayer structure, and instead may be a multilayer interconnection board comprising a plurality of laminated monolayer printed circuit boards. For example, the prepreg described above may be laminated between a printed circuit board and copper foil which have been separately fabricated, and then the copper foil worked into an outer layer circuit to obtain a multilayer interconnection board. The method of interlayer connection between the inner layer circuit (conductors of the printed circuit board) and outer layer circuit in this type of multilayer interconnection board is not particularly restricted, and as examples there may be mentioned a method of forming interlayer connection holes in the prepreg using a laser or the like and then plating or filling them with a conductive paste, and a method of using connection bumps previously formed on the inner layer circuit.

The multilayer interconnection board may be also comprise the aforementioned prepreg laminated between a plurality of separately fabricated printed circuit boards. In this case, the method of accomplishing interlayer connection between the circuits of each layer (conductors of the printed circuit board) may be, for example, a method of filling a conductive paste into the interlayer connection holes already formed in the prepreg using a laser or the like, or a method of using connection bumps previously formed on the inner layer circuit.

For such multilayer interconnection boards as well, as for the printed circuit board described above, a total thickness of 1-30 μm for the conductor formed in the flexible region and a total thickness of 30-150 μm for the conductors formed in the non-flexible regions will facilitate folding at the flexible region while satisfactorily maintaining rigidity of the non-flexible regions. As a result, this multilayer interconnection board can also be housed at high density by folding in electronic devices. Incidentally, it is not necessary for the multilayer interconnection board to have the same number of printed circuit boards laminated in all of the regions. For example, in order to ensure that the total thickness of the conductor in the flexible region is in the range of 1-30 μm, the construction may comprise a single layer for the flexible region and multilayering only for the non-flexible regions.

Figure 3:
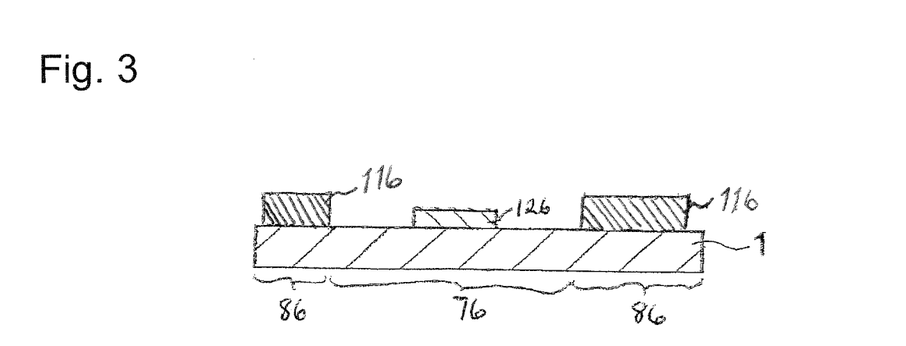
FIG. 3 is a cross-sectional view of an embodiment of the present invention having conductors formed on one side of the substrate.

FIG. 3 shows another embodiment of the present invention, having conductor 126 in the flexible region 76 and conductors 116 in the non-flexible regions 86, each on one side of the substrate 1.

EXAMPLES

The present invention will now be explained in greater detail through the following examples, with the understanding that these examples are in no way limitative on the invention.

Example 1

First, a 50 μm-thick imide-based prepreg (product of Hitachi Chemical Co., Ltd.) including a 0.019 mm-thick glass cloth (1027, product of Asahi Shwebel) was prepared. Next, a 18 μm-thick copper foil (F2-WS-18, product of Furukawa Circuit Foil Co., Ltd.) was superposed on one side of the prepreg while a 70 μm-thick copper foil (SLP-70, product of Nippon Denkai Co., Ltd.) was superposed on the opposite side, both with their bonding surfaces facing the prepreg. This was pressed with pressing conditions of 230° C., 90 minutes, 4.0 MPa to obtain a double-sided copper-clad laminate.

Both sides of the double-sided copper-clad laminate were laminated with MIT-225 (product of Nichigo-Morton Co., Ltd., 25 μm thickness) as an etching resist and worked into a prescribed pattern by a conventional photolithography technique. The copper foil was then etched with a ferric chloride-based copper etching solution. The etching was terminated when an etched pattern was formed on the 18 μm copper foil side, and was followed by rinsing and drying.

MIT-235 was then laminated on both sides of the substrate, after which one side (the 18 μm copper foil side) was exposed to light over the entire surface and the other side (the 70 μm copper foil side) was exposed to open only sections requiring folding, to form respective resist patterns. Next, the copper foil (residual copper) sections exposed at the opened sections were etched until the copper at those sections (sections requiring no flexibility) disappeared.

Upon completion of the etching, all of the etching resists were removed to obtain a double-sided printed circuit board. This yielded a printed circuit board having an 18 μm-thick conductor (circuit) in the flexible region (flexible section) and 70 μm-thick conductors (solid copper) formed on this circuit and the other side, in the non-flexible regions (rigid sections).

Example 2

First, a 50 μm-thick acrylic/epoxy-based prepreg (product of Hitachi Chemical Co., Ltd.) including a 0.028 mm-thick glass cloth (1037, product of Asahi Shwebel) was prepared. Next, a 3 μm-thick copper foil (MICROSENE, product of Mitsui Kinzoku Co., Ltd.) on both sides of the prepreg with the bonding surfaces facing the prepreg. This was pressed with pressing conditions of 180° C., 90 minutes, 4.0 MPa to obtain a double-sided copper-clad laminate.

Both sides of the double-sided copper-clad laminate were laminated with MIT-235 (product of Nichigo-Morton Co., Ltd., 35 μm thickness) as an etching resist and worked into a prescribed pattern by a conventional photolithography technique. This was followed by copper sulfate electroplating to form a 16 μm copper plating on both sides.

Next, both sides of the plated double-sided copper-clad laminate were further laminated with MIT-235, and then one side was exposed to light over the entire surface while the other side was exposed to open sections requiring no flexibility (solid pattern sections), to form respective resist patterns. Next, the plated copper exposed at the open sections was subjected to further electroplating, to a conductor thickness of 70 μm at those sections (sections requiring no flexibility).

Upon completion of the plating, all of the plating resists were removed and a sulfuric acid/hydrogen peroxide-based etching solution was used for etching to a copper foil thickness of 3 μm to form a conductor pattern, thus obtaining a double-sided printed circuit board. This yielded a printed circuit board having an 18 μm-thick conductor (circuit) in the flexible region (flexible section), and in the non-flexible regions (rigid sections), an 18 μm-thick conductor (circuit) on one side and a 70 μm-thick conductor (solid copper) on the side opposite that side.

Comparative Example 1

First, a 50 μm-thick imide-based prepreg (product of Hitachi Chemical Co., Ltd.) including a 0.019 mm-thick glass cloth (1027, product of Asahi Shwebel) was prepared. Next, a 35 μm-thick copper foil (GTS-35, product of Furukawa Circuit Foil Co., Ltd.) was superposed on both sides of the prepreg, with the bonding surfaces facing the prepreg. This was pressed with pressing conditions of 230° C., 90 minutes, 4.0 MPa to obtain a double-sided copper-clad laminate.

Both sides of the double-sided copper-clad laminate were laminated with MIT-225 (product of Nichigo-Morton Co., Ltd., 25 μm thickness) as an etching resist, and one side was worked into a prescribed pattern by a conventional photolithography technique while the other side was worked into a pattern covering the entire surface except for the flexible section.

The copper foil was then etched with a ferric chloride-based copper etching solution. The etching was completed when the 35 μm copper foil had been removed from the side bearing the resist on which the prescribed pattern had been formed and the opposite side on which the flexible section had been exposed, and this was followed by rinsing and drying.

Upon completion of the etching, all of the etching resists were removed to obtain a double-sided printed circuit board. This yielded a printed circuit board having an 35 μm-thick conductor (circuit) in the flexible region (flexible section), and in the non-flexible regions (rigid sections), conductors with a total thickness of 70 μm including a 35 μm-thick circuit and 35 μm-thick conductors (solid copper) formed on the side opposite it.

(Folding Test)

The printed circuit boards obtained in Examples 1 and 2 were each subjected to a folding test. The results demonstrated that both of the printed circuit boards could be freely folded at their flexible sections. Specifically, they could be folded 180° along a pin with a curvature radius of 0.5 mm. When the folded wiring boards were reopened, the folded sections exhibited no apparent problems such as cracking.

On the other hand, when the flexible section of the printed circuit board of Comparative Example 1 was folded 180° along a pin with a curvature radius of 0.5 mm in the same manner as described above and then opened at the flexible section, the flexible section was whitened and cracking was observed between the substrate and copper foil.

The invention claimed is:

1. A printed circuit board comprising:
a flexible substrate and conductors formed on at least one side of the flexible substrate,
the printed circuit board having a flexible region that bends and non-flexible regions that do not bend, the non-flexible regions having the flexible region therebetween, the flexible substrate being the only substrate and being provided in each of the flexible region and the non-flexible regions, the conductors including first conductors provided in the non-flexible regions and a second conductor provided in the flexible region, the first conductors, in a cross-section of the printed circuit board across the flexible and non-flexible regions, being separated from the second conductor,
wherein a total thickness of the second conductor, formed in the flexible region, is 1-30 µm and a total thickness of the first conductors, formed in the non-flexible regions, is 30-150 µm,
wherein the flexible substrate contains a fiber base material and the fiber base material is a glass cloth with a thickness of no greater than 50 µm, and
wherein the flexible substrate comprises a thermosetting resin composition, and the thermosetting resin composition comprises a siloxane-modified polyamideimide.

2. A printed circuit board according to claim 1, wherein the total thickness of the first conductors, formed in the non-flexible regions, is larger than the total thickness of the second conductor, formed in the flexible region.

3. A printed circuit board according to claim 1, wherein the total thickness of the second conductor, formed in the flexible region, is 6-60% of the total thickness of the first conductors, formed in the non-flexible regions.

4. A printed circuit board according to claim 3, wherein the total thickness of the second conductor, formed in the flexible region, is 10-30% of the thickness of the first conductors, formed in the non-flexible regions.

5. A printed circuit board according to claim 1, wherein the total thickness of the second conductor, formed in the flexible region, is adjusted to a thickness of 1-30 µm by etching.

6. A printed circuit board according to claim 1, wherein the total thickness of the first conductors, formed in the non-flexible regions, is adjusted to a thickness of 30-150 µm by plating.

7. A printed circuit board according to claim 1, wherein the total thickness of the second conductor, formed in the flexible region, is 3-25 µm, and the total thickness of the first conductors, formed in the non-flexible regions, is 60-120 µm.

8. A printed circuit board according to claim 1, wherein the total thickness of the second conductor, formed in the flexible region, is 8-20 µm, and the total thickness of the first conductors, formed in the non-flexible regions, is 70-100 µm.

9. A printed circuit board according to claim 1, wherein said siloxane-modified polyamideimide has been obtained by reaction of an aromatic diisocyanate with a mixture containing diimidedicarboxylic acid obtained by reaction of trimellitic anhydride and a mixture of a diamine with at least two aromatic rings and a siloxanediamine.

10. A printed circuit board according to claim 1, wherein the siloxane-modified polyamideimide resin contains at least 70% of polyamideimide molecules with at least 10 amide groups in the molecule.

11. A printed circuit board according to claim 1, wherein the first conductors are formed on both sides of the flexible substrate.

12. A printed circuit board according to claim 1, wherein the second conductor, formed in the flexible region, is formed on one side of the flexible substrate, and the first conductors, formed in the non-flexible regions, are formed on both sides of the flexible substrate.

13. A printed circuit board according to claim 1, wherein said flexible substrate consists of a same substrate provided in the flexible region and in the non-flexible regions.

14. A printed circuit board according to claim 13, wherein a rigid property of the non-flexible regions is imparted thereto by the first conductors, formed in the non-flexible regions.

15. A printed circuit board according to claim 1, wherein a rigid property of the non-flexible regions is imparted thereto by the first conductors, formed in the non-flexible regions.

16. A printed circuit board according to claim 15, wherein the total thickness of the second conductor, formed in the flexible region, is sufficiently thin such that the flexible region exhibits flexibility.

* * * * *